United States Patent [19]

Proud, Jr. et al.

[11] 4,104,558

[45] Aug. 1, 1978

[54] TUNABLE RADIO FREQUENCY PULSE GENERATORS

[75] Inventors: Joseph M. Proud, Jr., Wellesley Hills; William H. McNeill, Carlisle, both of Mass.

[73] Assignee: GTE Laboratories Incorporated, Waltham, Mass.

[21] Appl. No.: 741,928

[22] Filed: Nov. 15, 1976

[51] Int. Cl.² ............................ H01J 7/46; H01J 19/80
[52] U.S. Cl. ..................................... 315/39; 307/106; 333/13; 333/82 B; 331/127
[58] Field of Search ................... 315/39; 307/106, 107; 333/13, 82 B; 331/127

[56] References Cited

U.S. PATENT DOCUMENTS

| | | | |
|---|---|---|---|
| 3,479,555 | 11/1969 | Garwin | 315/39 |
| 3,484,619 | 12/1969 | Proud, Jr. | 315/39 |
| 3,748,528 | 7/1973 | Cronson | 315/39 |

Primary Examiner—Saxfield Chatmon, Jr.
Attorney, Agent, or Firm—Fred Fisher

[57] ABSTRACT

A tunable frequency pulse generator capable of providing high energy pulses having an in-line construction includes an annularly shaped spark gap and a movable insulator support which includes a conductive sleeve that varies the resonant frequency of the generator. The input voltage is connected to the resonant element through a central aperture provided in the spark gap rings for high efficiency operation.

5 Claims, 3 Drawing Figures

TUNABLE RADIO FREQUENCY PULSE GENERATORS

BACKGROUND OF THE INVENTION

This invention relates to radio frequency pulse generating devices and, in particular, to tunable microwave pulse generators.

It is known to product bursts of microwave energy by switching power across a gap or gaps in the central conductor of a coaxial line or wave guide as shown in U.S. Pat. No. 3,521,121 issued July 21, 1970 to J. M. Proud, Jr., U.S. Pat. No. 3,484,619 issued Dec. 16, 1969 to J. M. Proud, Jr., and U.S. Pat. No. 3,748,528 issued July 24, 1973 to H. Cronson. These devices are capable of providing high energy pulse bursts of microwave power up to approximately 10 GHz. In the waveguide device disclosed in the patent to H. Cronson, the center conductor of the coaxial line is provided with one or more switching gaps along its length and/or the end post spaced from the interior wall of the waveguide. A radio frequency (RF) block or impedance is disposed around the post adjacent the first switching gap with the gaps so dimensioned that energy switched by the first gap can pass the block or impedance, but oscillations caused by the discharge at the second gap cannot pass the block. The spark gap functions to steepen the leading edge of the travelling wave. The prior art structures possess several shortcomings which the instant invention overcomes. These shortcomings include, but are not limited to, poor efficiency, since the capacitance of the RF block, to be effective, must be relatively large compared to the distributed capacity of the end post. The capacitance of the RF block stores most of the initial energy and, upon discharge, tends to react with the lumped value of inductance in the post, resulting in low frequency oscillations which typically are less than one-half the desired operating frequency. In the Cronson waveguide device, mentioned hereinbefore, such oscillations lie below the waveguide cut-off frequency and would not be observed. However, the existence of such oscillations have been observed by the applicant using coaxial resonators operating in the lowest TEM mode with no cut-off frequency. This problem cannot be overcome by reducing the capacitance of the RF block since this would permit the microwave oscillations to leak out of the resonant structure.

Furthermore, the Cronson device requires a spark gap of relatively small dimensions to provide rapid charging of the end post. This causes the small electrode surface of the gap to wear rapidly under sparking causing rapid deterioration of the fast switching properties of the closely spaced spark gap. A sliding short is also used to adjust the coupling between the waveguide and the end post. However, it does not enable tuning of the generator since the microwave frequency generated is determined primarily by the cross-sectional dimensions of the waveguide.

The present invention is primarily concerned with a means for tuning or changing the resonant frequency of the waveguide, which heretofore was determined by the dimensions of the waveguide and the resonant element disposed therein.

Therefore, it is an object of the present invention to overcome the shortcomings of presently known radio frequency generators.

It is a further object of the present invention to provide a tunable highly efficient, high power radio frequency generator.

Another object of the present invention is to provide a simplified tunable radio frequency generator which converts DC energy into RF energy.

A still further object of the present invention is to provide a tunable microwave frequency generator which is small in size and relatively inexpensive to manufacture as compared to conventional RF microwave generators of equal output power.

The foregoing and other objects and advantages will appear from the description to follow. In the description, reference is made to the accompanying drawings which form a part thereof, and in which is shown by way of illustration a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense and the scope of the present invention is best defined by the appended claims.

SUMMARY OF THE INVENTION

A tunable frequency generator for providing high energy pulses, according to the principles of the instant invention, comprises in combination: an elongated resonant cavity having an open end and an essentially closed end; insulator means for varying the resonant frequency of said generator, said means adapted to movably cooperate with the cavity open end and having an inwardly extending portion, the inwardly extending portion being movable along the longitudinal axis of the cavity and including support means; an elongated resonant element centrally disposed within the resonant cavity, one end thereof being slidably received by the support means of the insulator means for changing its effective length, the resonant element being provided with input receiving means at its other end proximate the longitudinal axis thereof; switching means disposed on the other end of the resonant element and connected to the closed end of said resonant cavity; and input terminal means adapted to be coupled to a source of pulsed DC voltage and including an electrically conductive means for providing a conductive path to the resonant element input receiving means.

BRIEF DESCRIPTION OF THE DRAWING

In order that the invention may be more fully understood, it will now be described, by way of example, with reference to the accompanying drawing in which.

DESCRIPTION OF THE PREFERRED EMBODIMENT

Figure 1:
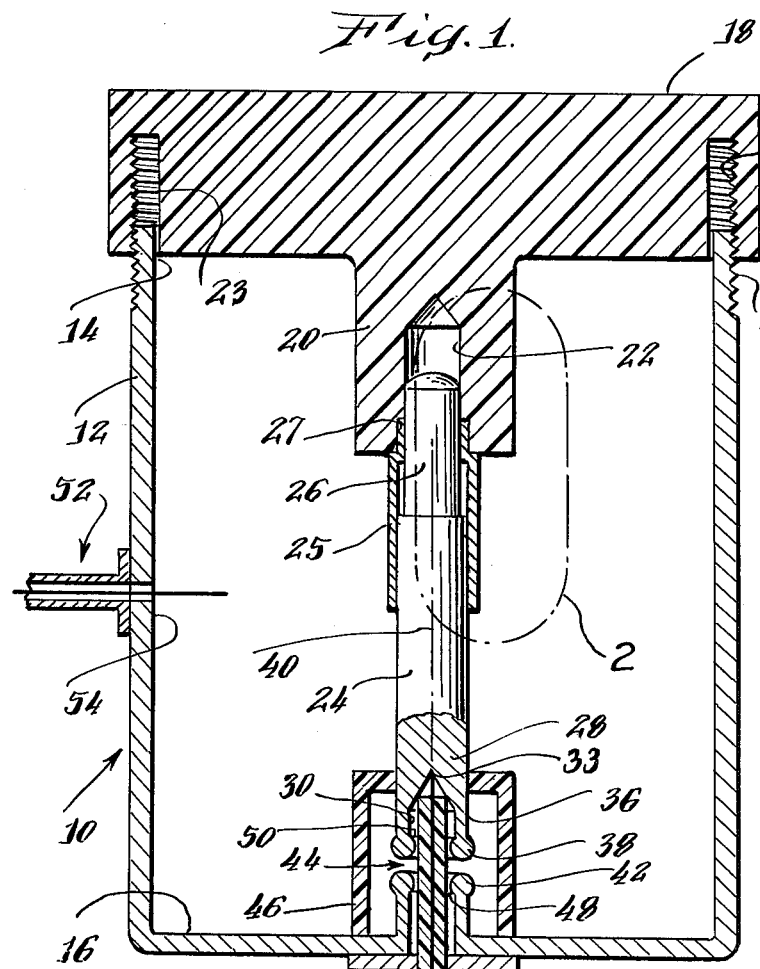
FIG. 1 is a pictorial representation, in cross-section, of a preferred embodiment which includes the principles of the present invention.

The preferred embodiment of the tunable high energy radio frequency generator 10 of the present invention is shown in FIG. 1. An elongated resonant cavity 12 of the coaxial type (coaxial resonator) is provided with an open end 14 and an essentially closed end 16. An insulator element 18 is of generally circular shape and is fabricated with threads 19 adapted to cooperate with mating threads 21 provided on the external surface of the open end 14 of the conductive coaxial resonator 12. The inner edge portion 23 mates with and effectively seals the open end 14 of resonator 12, thereby confining all of the microwave energy within the coaxial resonator.

The insulator element 18 is further provided with an inwardly extending portion 20 having a circular aperture 22 centrally disposed therein which functions as a receptacle and support for the anti-node end 26 of an elongated cylindrically-shaped resonant element 24 which preferably is one-quarter wavelength long.

The insulator element 18, in addition to providing support and electrical insulation for the resonant element 24, also determines, in part, the effective electrical length or propagation time for electromagnetic waves which travel along the surface of resonant element 24. This results from the slowing of such waves when the medium between the cavity wall 12 (outer conductor) and the resonant element 24 (inner conductor) contains a dielectric material with a relative dielectric constant greater than unity. The longer propagation time leads to a longer wave period for oscillations within the cavity. The magnitude of the increase in period may be shown to be directly related to the amount of material which surrounds resonant element 24 and to the relative dielectric constant of such material.

The preferred embodiment of the present invention includes an electrically conductive sleeve 25 which is affixed to the inner circumferential edge 27 of aperture 22. Sleeve 25 is fabricated to slidably engage the circumference of the resonant element 24. The end 26 of resonant element 24 is stepped downward in the general area where sleeve 25 surrounds the resonant element 24.

Figure 2:
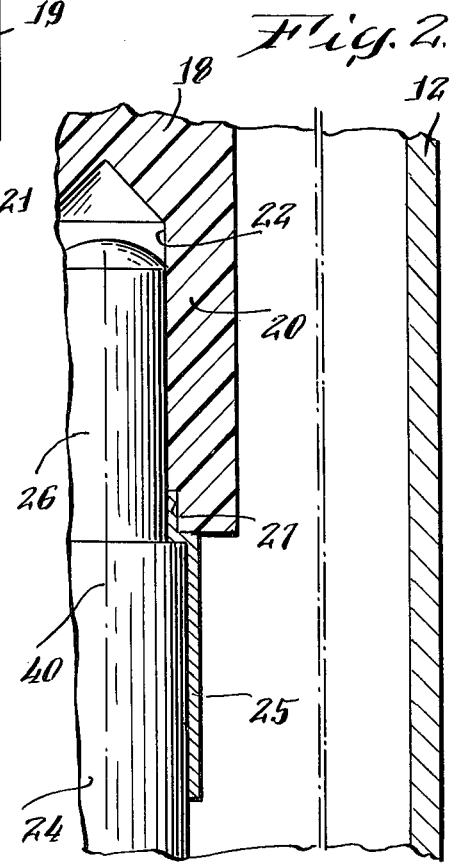
FIG. 2 is an enlarged view of the area within the broken line 2 shown in FIG. 1 and shows the resonant element tuned to its shortened or highest frequency position.
Figure 3:
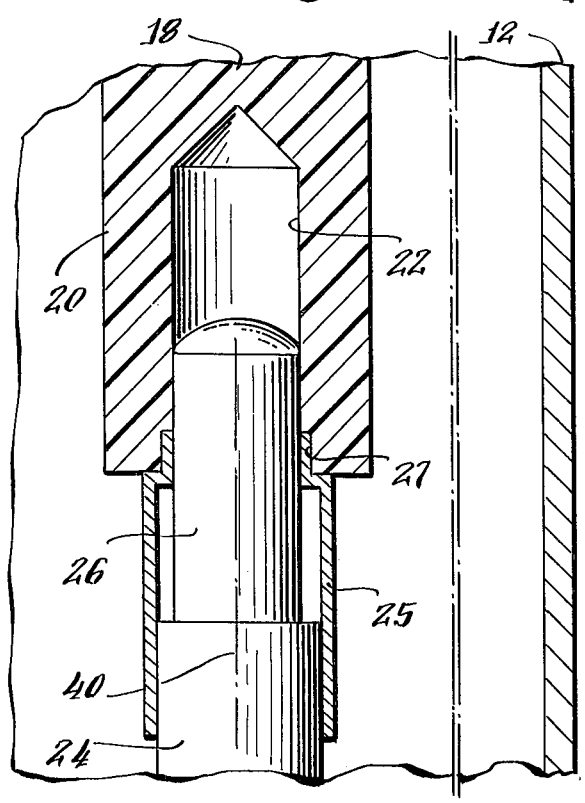
FIG 3 is an enlarged view of the area shown in FIG. 2 with the resonant element tuned to its longest or lowest frequency position.

It is realized by those knowledgeable in the art that it is desirable to maintain a constant characteristic impedance ($Z_o$) over the entire length of the resonant element 24 and it may be accomplished by using the stepped down configuration illustrated. In order to maintain the characteristic impedance uniform for variable positions of the dielectric, it is necessary to provide means for restoring the impedance for the resonant element when the insulator 18 (dielectric) is moved from the position shown in FIG. 2 to the position shown in FIG. 3. The metallic electrically conductive sleeve 25 maintains a constant radius on the resonant element 24 when the (dielectric) insulator 18 is progressively moved as the generator 10 is tuned. The tuning range may be adjusted over a relatively wide range (20%).

The design of the presently disclosed sliding dielectric tuning method may be developed from established coaxial transmission line formula as shown by N. Marcuvitz in the Waveguide Handbook, published by McGraw-Hill, New York (1951) and is incorporated herein by reference.

The other end 28 of the resonant element 24 is provided with an aperture 30 which functions as the input voltage receiving terminal and is in electrically conductive contact with the input terminal means 32 at point 33 via an electrically conductive wire path which forms the inner conductor of a coaxial input line. The coaxial input line includes an outer conductor 35 and a dielectric 34.

The edge portion 36 of the end 28 of the resonator element 24 is provided with a first annular ring 38 transverse to the longitudinal axis 40 of the resonant element 24. A second annular ring 42 is displaced from and in juxtaposition with the first annular ring 38 and coaxially aligned therewith and connected to the closed end 16 of the coaxial resonator 12, thereby forming a spark gap 44.

An electrically non-conducting member 46 maintains the end 28 of the resonant element 24 in a fixed position thereby fixing the spark gap 44 at a predetermined distance.

It is to be noted that the conductive path from the input terminal means 32 passes through apertures 48 and 50 provided in rings 42 and 38, respectively, thus permitting internal connection to the resonant element 24 at point 33. The point of contact 33 from the input terminal 32 is made at virtually zero microwave field so that little or no conducted microwave loss can occur via the input terminal means 32 and conductive path. Since the contact point 33 is at a virtually zero mircowave field, the requirement for a RF block used in the prior art resonant structures is obviated. Input terminal 32 is adapted to be coupled to a source of high voltage pulsed DC, not shown.

A conventional output probe 52 may be unobstructively provided in the cavity wall 54 at a convenient position between the open 14 and closed 16 ends of the cavity 12.

In operation, the rapid breakdown of spark gap switch 44 generates microwave oscillations within the resonant cavity 12 which are confined to the space between the resonant element 24 and the walls 54 of the cavity 12. Output energy is obtained via probe 52.

The generator 10 may be tuned to a different frequency (resonant point) by rotating insulator 18, which, in view of the cooperating threads 19 and 21, causes the sleeve 25 to move along resonant element 24, thereby changing its effective (electrical) length.

Penetration into the metallic conductors is very small due to the well-known skin effects of microwave energy. The use of annular rings for electrodes to form the spark gap clearly reduces the wear occasioned by the use of a conventional spark gap which utilizes centrally located electrodes. The wear characteristics of the annular ring electrodes has been found to be one order of magnitude better, which more than offsets the initial increased difficulty in maintaining parallelism and accurate spark gap spacing over the annular region. The nature of wear with the annular ring electrodes tends to be in the direction to maintain parallelism.

It will be understood that various changes in the details, materials, arrangements of parts and operating conditions which have been herein described and illustrated in order to explain the nature of the invention may be made by those skilled in the art within the principles and scope of the invention.

Having thus set forth the nature of the invention, what is claimed is:

1. A tunable radio frequency generator for providing high energy pulses comprising in combination:
   a. an elongated resonant cavity having an open end and an essentially closed end;

b. insulator means for varying the resonant frequency of said generator, said means adapted to movably cooperate with said cavity open end to vary the distance between said open end and said closed end and having an inwardly extending portion, said inwardly extending portion being movable along the longitudinal axis of said cavity and including support means;

c. an elongated resonant element centrally disposed within said resonant cavity, one end thereof being slidably received by the support means of said insulator means for changing its effective length, said resonant element being provided with input receiving means at its other end proximate the longitudinal axis thereof;

d. switching means disposed on said other end of said resonant element and connected to said closed end of said resonant cavity; and e. input terminal means adapted to be coupled to a source of pulsed DC voltage and including an electrically conductive means for providing a conductive path to said resonant element input receiving means.

2. A tunable radio frequency generator according to claim 1 wherein said cavity open end and said insulator means are provided with cooperating threaded portions for movement of said insulator along the longitudinal axis of said resonant cavity.

3. A tunable radio frequency generator according to claim 1 wherein said insulator support means includes an electrically conductive sleeve for slidably engaging with said resonant element.

4. A tunable radio frequency generator according to claim 1 wherein said switch means comprises a spark gap formed with a pair of annular rings with a gap therebetween, one of said rings being disposed on the edge portion of said other end transverse to said longitudinal axis, the other of said rings being juxtaposed and coaxially aligned with said one ring and connected to said closed end of said resonant cavity.

5. A tunable radio frequency generator according to claim 4 wherein said conductive path to said resonant element input receiving means passes through a centrally disposed aperture provided in said annular spark gap rings.

* * * * *